(12) United States Patent
Clark et al.

(10) Patent No.: US 11,235,574 B2
(45) Date of Patent: Feb. 1, 2022

(54) FLUID PROPELLING APPARATUS INCLUDING A HEAT SINK

(71) Applicant: Hewlett-Packard Development Company, L.P., Houston, TX (US)

(72) Inventors: Garrett E. Clark, Corvallis, OR (US); Michael W. Cumbie, Corvallis, OR (US); Chien-Hua Chen, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 583 days.

(21) Appl. No.: 15/772,377

(22) PCT Filed: Feb. 29, 2016

(86) PCT No.: PCT/US2016/020041
§ 371 (c)(1),
(2) Date: Apr. 30, 2018

(87) PCT Pub. No.: WO2017/151091
PCT Pub. Date: Sep. 8, 2017

(65) Prior Publication Data
US 2018/0319655 A1    Nov. 8, 2018

(51) Int. Cl.
*B01L 99/00* (2010.01)
*B41J 2/05* (2006.01)
(Continued)

(52) U.S. Cl.
CPC ........... *B41J 2/1404* (2013.01); *B01L 3/5027* (2013.01); *B01L 3/50273* (2013.01); *B01L 3/502707* (2013.01); *B41J 2/1433* (2013.01);
*B81B 1/006* (2013.01); *B81B 7/0083* (2013.01); *B81C 1/00119* (2013.01); *F04B 43/046* (2013.01); *B01L 3/502784* (2013.01);
(Continued)

(58) Field of Classification Search
None
See application file for complete search history.

(56) References Cited

U.S. PATENT DOCUMENTS 5,657,061 A    8/1997    Seccombe et al.
6,378,994 B1    4/2002    Ueda et al.
(Continued)

FOREIGN PATENT DOCUMENTS

EP    2886355    6/2015
JP    2001-253076 A    9/2001
(Continued)

OTHER PUBLICATIONS

Shen, S-C. et al., "Manufacture of an Integrated Three-dimensional Structure Nozzle Plate Using Microinjection Molding for a 1200-dpi Inkjet Printhead", Journal of Microelectromechanical Systems, Feb. 2009, 12 pages, vol. 18, No. 1.

*Primary Examiner* — Paul S Hyun
(74) *Attorney, Agent, or Firm* — Law Offices of Michael Dryja

(57) ABSTRACT

A fluid propelling apparatus, including a plastic compound, a MEMS at least partially surrounded by the compound, and a heat sink next to the MEMS, to transfer heat away from the MEMS, wherein the heat sink is at least partly surrounded by the compound.

16 Claims, 7 Drawing Sheets

(51) Int. Cl.
*B41J 2/14* (2006.01)
*B01L 3/00* (2006.01)
*F04B 43/04* (2006.01)
*B81B 1/00* (2006.01)
*B81B 7/00* (2006.01)
*B81C 1/00* (2006.01)
*F04B 19/00* (2006.01)

(52) U.S. Cl.
CPC ... *B01L 2300/087* (2013.01); *B01L 2300/088* (2013.01); *B01L 2300/0867* (2013.01); *B01L 2300/1827* (2013.01); *B01L 2300/1894* (2013.01); *B01L 2400/046* (2013.01); *B01L 2400/0442* (2013.01); *B81B 2203/0338* (2013.01); *F04B 19/006* (2013.01)

(56) References Cited

U.S. PATENT DOCUMENTS

| | | | |
|---|---|---|---|
| 6,409,316 B1 * | 6/2002 | Clark | B41J 2/1604 347/63 |
| 6,607,259 B2 | 8/2003 | Mott et al. | |
| 6,908,170 B2 | 6/2005 | Merz | |
| 8,221,885 B2 | 7/2012 | Miller | |
| 8,496,317 B2 | 7/2013 | Ciminelli et al. | |
| 9,132,633 B2 | 9/2015 | Iijima | |
| 9,815,282 B2 | 11/2017 | Chung et al. | |
| 2005/0024457 A1 | 2/2005 | Hilton et al. | |
| 2005/0287707 A1 | 12/2005 | Lin et al. | |
| 2007/0019038 A1 | 1/2007 | Lee et al. | |
| 2007/0081029 A1 | 4/2007 | Worsman et al. | |
| 2007/0081033 A1 | 4/2007 | Silverbrook | |
| 2011/0227987 A1 | 9/2011 | Pan et al. | |
| 2013/0083136 A1 | 4/2013 | Govyadinov et al. | |
| 2018/0333956 A1 | 11/2018 | Chen et al. | |

FOREIGN PATENT DOCUMENTS

| | | |
|---|---|---|
| JP | 2005-047272 A | 2/2005 |
| JP | 2006137065 | 6/2006 |
| JP | 2007320116 | 12/2007 |
| JP | 2004209747 | 9/2011 |
| JP | 2013-501655 A | 1/2013 |
| JP | 2013-532594 A | 8/2013 |
| JP | 2014213460 | 11/2014 |
| WO | 2014/133561 A1 | 9/2014 |
| WO | 2014/133576 A1 | 9/2014 |
| WO | WO-2014133516 | 9/2014 |
| WO | 2016/003407 A1 | 1/2016 |

* cited by examiner

FLUID PROPELLING APPARATUS INCLUDING A HEAT SINK

BACKGROUND

High precision fluid propelling apparatus include labs-on-a-chip, printheads, and digital titration devices, amongst others. A fluid propelling apparatus can include a MEMS adapted to move fluid through small, for example micron-sized, fluid channels. Such MEMS may include a silicon substrate and thin film layer circuitry deposited on the substrate. It can be advantageous to reduce the amount of silicon in a fluid propelling apparatus, for example by reducing a thickness, width and/or length etc. Reducing a width and/or length of a silicon substrate may facilitate extracting more MEMS-substrates from a single wafer. Reducing a thickness of a silicon substrate may allow for cheaper wafers. Generally, reducing the amount of silicon in a MEMS may reduce costs.

DRAWINGS

Figure 3:
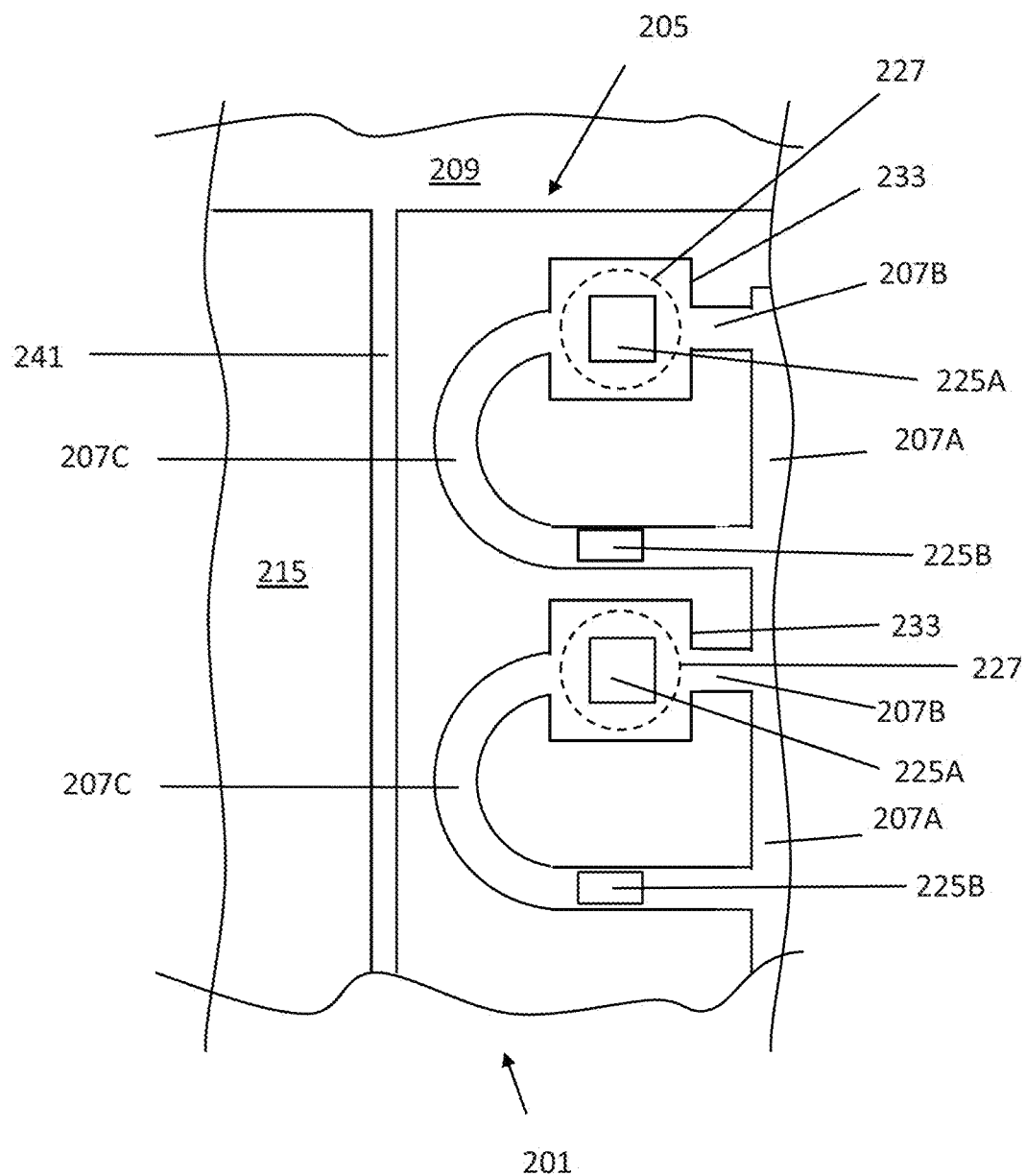
Figure 4:
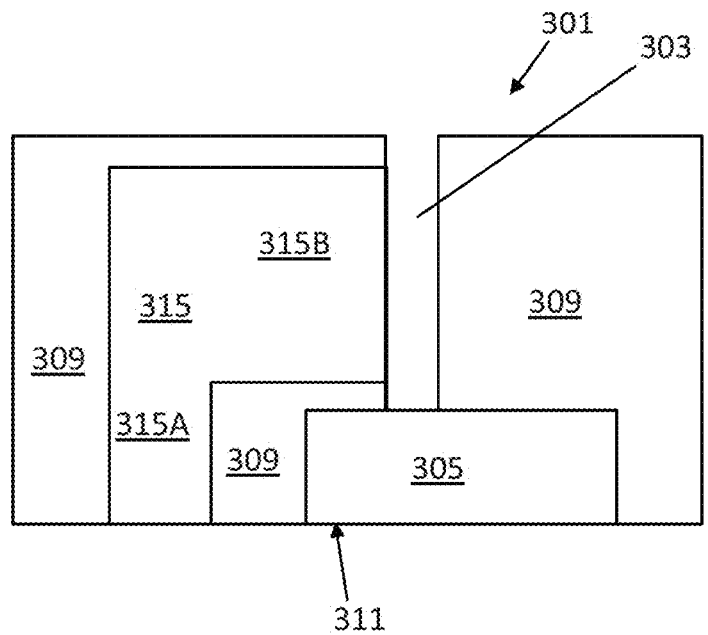
Figure 5:
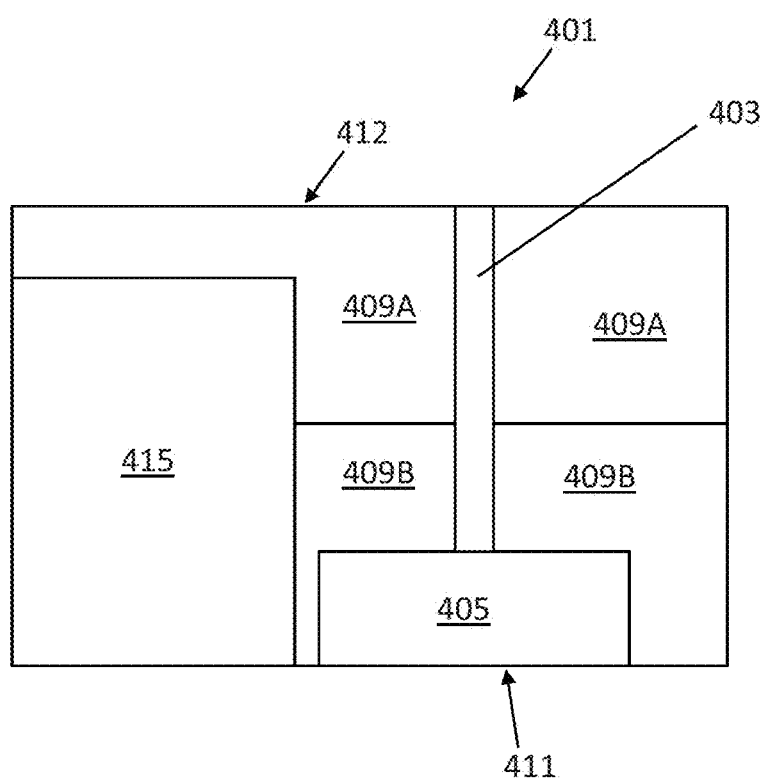
Figure 10:
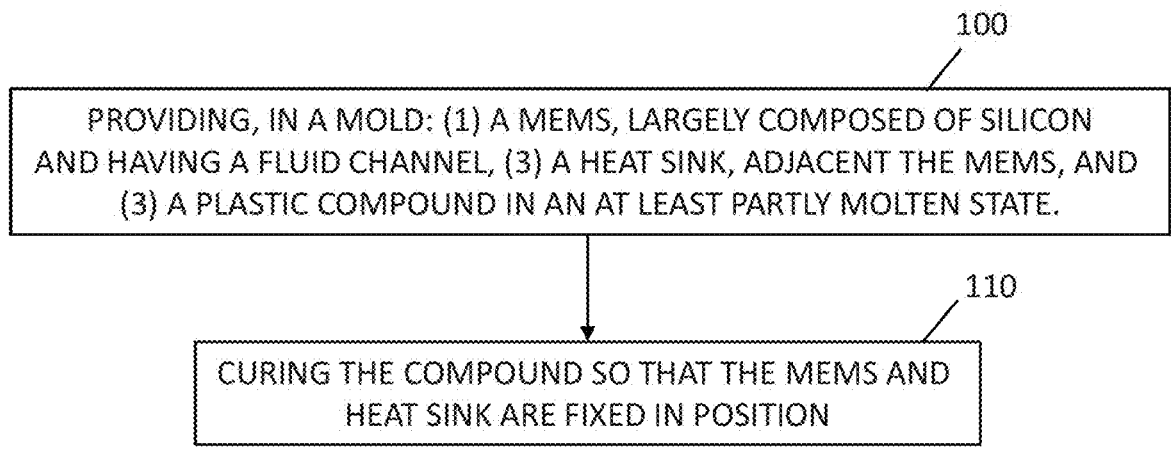
Figure 11:
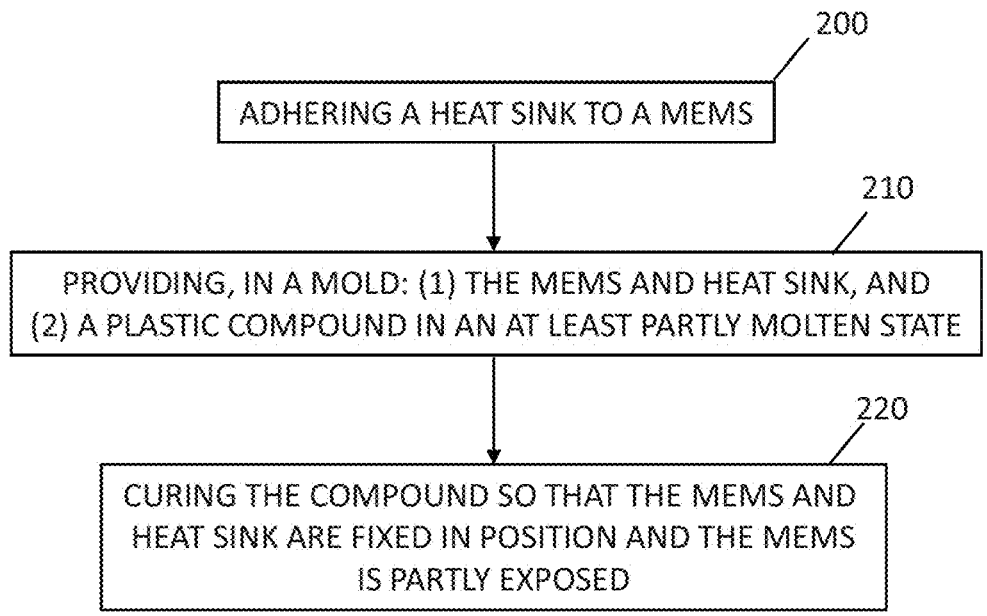
Figure 12:
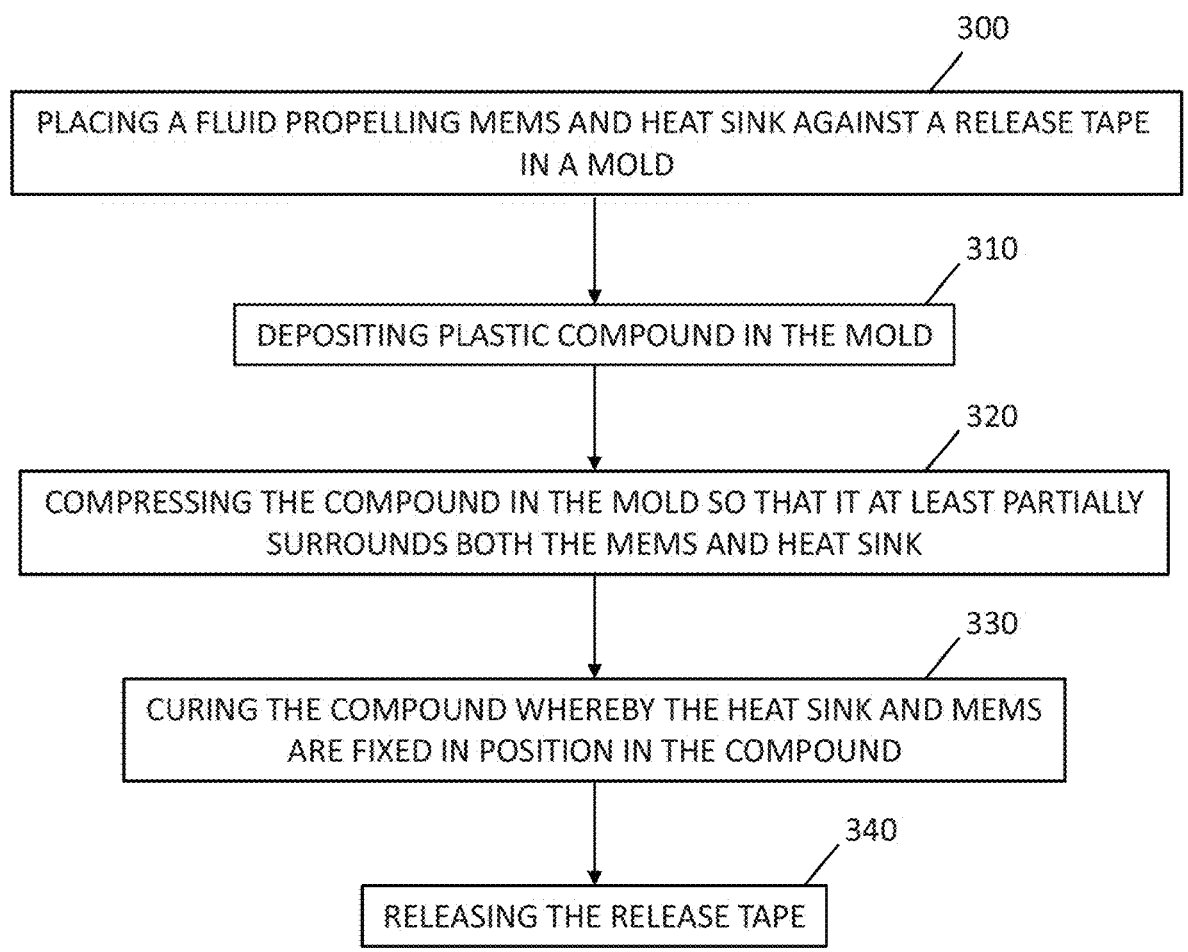
Figure 13:
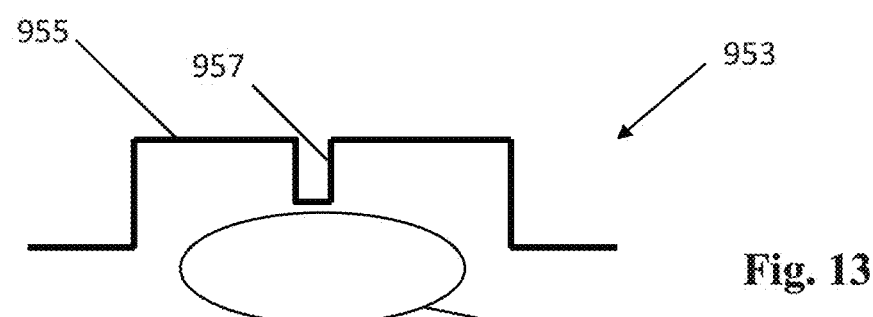
Figure 14:
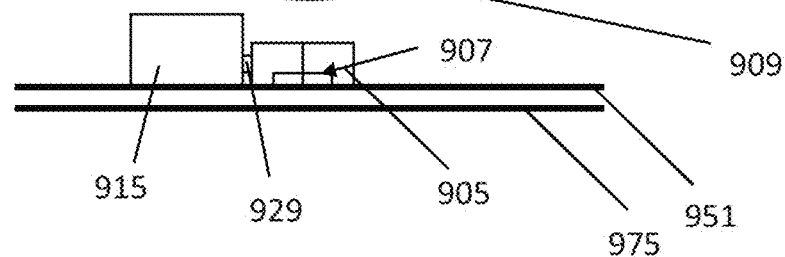
Figure 15:
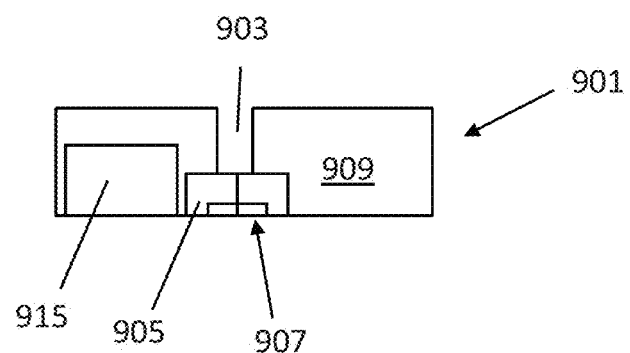

FIG. 3 a diagram of a cross section in top view of yet another example of a fluid propelling apparatus;

FIG. 4 illustrates a diagram of a cross section in a side view of a portion of an example fluid propelling apparatus;

FIG. 5 illustrates a diagram of a cross section in a side view of a portion of another example fluid propelling apparatus;

FIGS. 6-9 illustrate different example layouts of pluralities of MEMS and corresponding heat sinks in fluid propelling apparatus, in respective top views;

FIG. 10 illustrates an example of a method of manufacturing a fluid propelling apparatus;

FIG. 11 illustrates another example of a method of manufacturing a fluid propelling apparatus;

FIG. 12 illustrates yet another example of a method of manufacturing a fluid propelling apparatus; and FIG. 13-15 illustrates steps in an example method of manufacturing a fluid propelling apparatus.

DESCRIPTION

Figure 1:
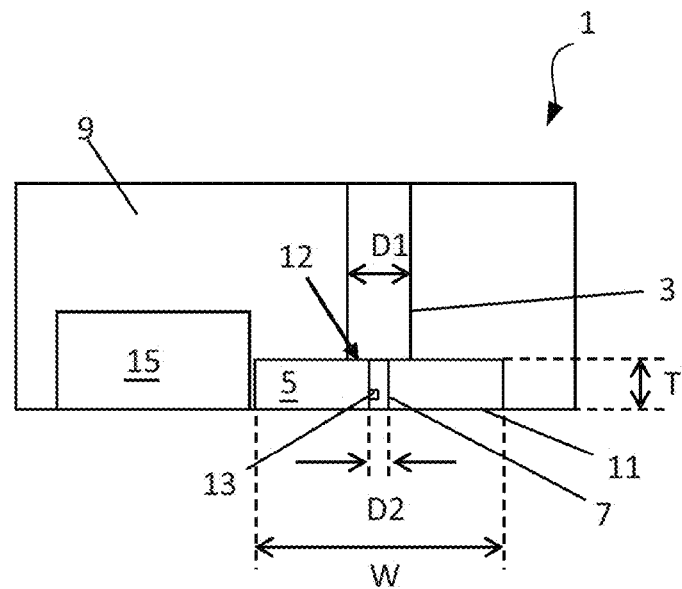
FIG. 1 illustrates a diagram of an example of a fluid propelling apparatus.

FIG. 1 illustrates an example of a fluid propelling apparatus 1. The fluid propelling apparatus is provided with a fluid channel 3, 7 through which fluid is to be propelled. In different examples, the fluid propelling apparatus 1 can include, or be a component of, a lab-on-a-chip, a printhead or a digital titration device. The lab-on-a-chip or digital titration device can be optimized for relatively high precision lab applications. The printhead can be a high precision inkjet printhead, or any high precision fluid dispensing head for 2D or 3D printing. Certain examples of the fluid propelling apparatus 1 may be arranged to eject fluid from nozzles, such as said printhead or digital titration device, while other examples may not necessarily eject the fluid but for example move the fluid along certain sensors or reactor chambers in the channels. Suitable applications for the fluid propelling apparatus 1 may include, but are not limited to, inkjet printing, 3D printing, digital titration, diagnosis, chemical reactors, etc. In different examples, the fluid may be a liquid, or a liquid mixed with gas. Examples of suitable liquids are ink, agents, 3D printing agents such as inhibitors or fusing agents, etc.

In an example, the fluid propelling apparatus 1 includes a MEMS (Micro-Electro-Mechanical System) 5. The MEMS 5 includes at least one second fluid channel 7. The MEMS 5 includes an actuator 13 to move fluid through the second channel 7.

The fluid propelling apparatus 1 may include a structure of a plastic compound 9, for example a substantially rigid structure. The plastic compound 9 may be an epoxy-mold compound, for example commercially available CEL400ZHF40WG from Hitatchi Chemical®. Fillers such as silica or metal oxide may be used. The MEMS 5 is embedded in the plastic compound structure 9. In this disclosure embedded may be understood as at least partially surrounded in such a manner as to be fixed in the compound by the compound. For example, most of the external surface of the MEMS 5 contacts the compound 9. In the illustrated example, the MEMS 5 is surrounded by the plastic compound 9 except for a front face 11 of the MEMS 5 that is exposed to ambient air, and a back portion 12 of the MEMS 5 that may be exposed to the first fluid channel 3. In one example, embedding can be achieved by overmolding the MEMS by the compound using compression molding techniques.

The plastic compound structure 9 includes a first fluid channel 3 that is fluidically connected to the second fluid channel of the MEMS 5 to allow fluid to be delivered to the second fluid channel 7 through the first fluid channel 3. In one example, the first fluid channel 3 has a smallest cross sectional diameter D1 between opposite walls of the first fluid channel 3, and the second fluid channel 7 has a smallest cross sectional diameter D2 between opposite walls of the second fluid channel 7, wherein the smallest cross sectional diameter D2 of the second fluid channel 7 is smaller than the smallest cross sectional diameter D1 of the first fluid channel 3. The smallest diameter D2 of the second fluid channel 7 can be less than 40 microns, less than 20 microns, less than 10 microns or less than 7 microns at certain locations. The second fluid channel 7 may include a network of fluid channels, for example wherein at least one single fluid channel branches off into multiple fluid channels of smaller diameters. For example, the second fluid channels may deliver fluid to a nozzle array having a density of more than 300 nozzles per inch of length, more than 600 nozzles per inch, more than 900 nozzles per inch, or more than 1200 nozzles per inch in a single row.

Herein the number of nozzles per inch should be understood as a relative density, that is, in certain examples the length of the MEMS 5 is less than an inch. For example a MEMS 5 having a density of approximately 1200 nozzles per inch, and having a nozzle array length of 3 millimeter would have approximately 142 nozzles.

In one example most of the MEMS consists of silicon. For example the MEMS includes a silicon substrate with thin film layers deposited on the substrate, for example SU8-based or polymer-type layers. For example, the silicon substrate is made of a single-crystal silicon.

In one example, the MEMS 5 is sliver shaped. The MEMS 5 may have a length (extending into the face of FIG. 1) of several millimeters or centimeters, for example at least 0.2 centimeter, at least 0.5 centimeter or at least 1 centimeter. The MEMS 5 may have a width W of less than 2.3 millimeters, for example less than 1.5 millimeters, for example less than approximately 1 millimeters. The MEMS 5 may have a thickness T less than 0.8 millimeters, for example less than 0.5 millimeters, less than 0.3 millimeters, less than approximately 0.2 millimeters or less than approximately 0.15 millimeters. The MEMS 5 includes an actuator array 13 to actuate on the fluid. The actuator array 13 is provided in the second fluid channel 7. For example the array 13 consists of a plurality of actuators that are provided along the length of the MEMS 5. The actuators 13 may be thermal resistors or piezo actuators.

A heat sink 15 can be provided adjacent the MEMS 5. The heat sink 15 is embedded in the plastic compound structure 9 adjacent the MEMS 5. The heat sink 15 may be partially or completely surrounded by the plastic compound 9. In one example, the heat sink 15 has been overmolded by the plastic compound, for example using a compression molding process, at the same time as the MEMS 5.

The heat sink 15 may conduct heat away from the MEMS 5. In different examples, the actuators 13 in the MEMS 5 may generate heat. In examples where thermal actuators 13 are provided at a relatively short pitch, for example at a resolution of at least approximately 300, 600, 900, 1200 or 1800 actuators per inch of length, heat may be generated. The MEMS 5 may heat where many actuators 13 are activated in a relatively short time frame. The heat generated by the actuators 13 will be conducted by the silicon substrate, fluid and perhaps thin film layers of the MEMS 5. Where the MEMS 5 is of relatively small thickness and/or width, such as is the case for some examples of this disclosure, there may not be enough silicon or fluid to counter too much heat generation in certain operational conditions. In a further example the thermal resistors may include both ejector resistors and pump resistors in a thin film layer, for example a row of at least 600 ink ejector resistors and a row of at least 300 pump resistors per inch. In such arrangements, the pump resistors may add to the heat generation as compared to MEMS with only ejector resistors.

While other solutions relied on the MEMS substrate to actuate as a heat sink 15, in this disclosure a separate heat sink 15 is used that may be more cost efficient than a silicon substrate, for example of single-crystal, while having suitable thermal conductivity properties. A separate heat sink 15 along the MEMS 5 may aid in conducting the heat away from the MEMS 5. The separate heat sink 15 may facilitate smaller MEMS 5, with a relatively low amount of processed silicon, combined with increased thermal resistor amounts and/or densities.

In one example the total volume of the heat sink (or heat sinks) 15 in the fluid propelling apparatus 1 may be more than the total volume of the at least one MEMS 5 in the fluid propelling apparatus 1. Hence, the silicon in the MEMS 5 may be reduced while any heat generation risk can be countered by a relatively larger heat sink 15 that can conduct and store sufficient heat. The costs of extra heat sink 15 material may be relatively low as compared to the costs of the silicon material.

Figure 2:
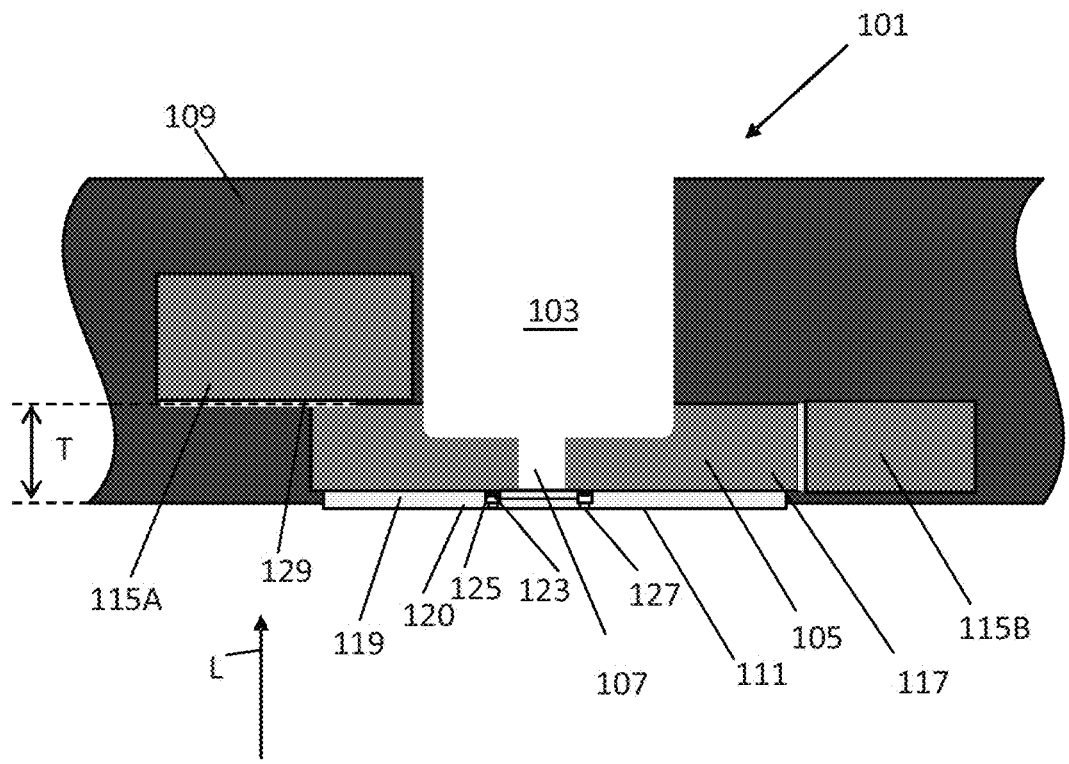
FIG. 2 illustrates a diagram of another example of a fluid propelling apparatus.

FIG. 2 illustrates another example of a fluid propelling apparatus 101. The fluid propelling apparatus 101 is a fluid ejection apparatus. The fluid propelling apparatus 101 includes a plastic compound structure 109. A MEMS 105, largely comprised of silicon, is embedded in the compound 109. The MEMS 105 may have a longitudinal shape. In FIG. 2 the length extends into the face of the drawing. Heatsinks 115A, 115B are provided along the MEMS 105 to conduct heat away from the MEMS 105.

The MEMS 105 comprises a substrate 117, carrying a thin film structure 119 having films of several microns of thickness. For example, a total thickness T of the MEMS 105 may be approximately 0.5 millimeters or less, approximately 0.3 millimeters or less, approximately 0.2 millimeters or less, or approximately 0.15 millimeters or less, wherein the thickness of the thin film structure 119 may be of several tens of microns, for example 50 microns or less, 40 microns or less, 30 microns or less, 20 microns or less, or 15 microns or less. The thin film structure 119 may include SU8. The thin film structure 119 includes a nozzle plate 120 through which nozzles 127 extend, in the front face 111. The thin film structure 119 may include ink ejection chambers 123 in which ink ejection actuators 125 are provided to eject ink out through the nozzles 127. A length of the arrays of the ink ejection actuators 125 may extend into the face of the drawing, along both sides of a second fluid feed hole 107, along the length of the MEMS 105. The ink ejection actuators 125 may be thermal resistors.

The compound 109 includes a first fluid feed slot 103 along the length of the MEMS 105. The MEMS 105 includes a second fluid feed slot 107 downstream of the first fluid feed slot 103. The second fluid feed slot 107 may deliver fluid to each of the fluid ejection chambers in the thin film structure 119.

As said, the first and second fluid feed slots may extend along a length of the MEMS 105. In another example, the first and/or second fluid feed slot 103, 107 include multiple discrete fluid feed holes. In an example these discrete fluid feed holes may be interconnected through at least one longitudinal manifold channel. The fluid feed slot or channel design may depend on the chosen formation and/or machining method.

The fluid propelling apparatus 101 includes a plurality of heat sinks 115A, B to conduct heat away from the MEMS 105. Each heat sink 115A, 115B extends at least partially next to the MEMS 105 as seen from a direction L perpendicular to the front face 111.

A first heat sink 115A extends partially next to the MEMS 105, as seen from the direction L perpendicular to the front face 111, and partially on top of the MEMS 105, and is surrounded by the compound 109 and/or MEMS 105. In one example, the first heat sink 115A touches the MEMS 105, or is connected to the MEMS 105 with thermally conductive lines and/or adhesive. In another example the heat sink 115A extends at a small distance from the MEMS 105 that is small enough to conduct heat away from the MEMS 105, for example 0.5 millimeter or more, or 1 millimeter or more. A layer of adhesive or a layer of plastic compound may extend between the heat sink 115A and MEMS 105. For example, the first heat sink 115A has been adhered to the MEMS 105 prior to the molding process to position the heat sink 115A with respect to the MEMS 105 in the molded compound 109. In one example, the adhesive may substantially dissolve during manufacture when hot plastic compound surrounds the MEMS 105 and heat sink 115A. In another example, the plastic compound may extend between the MEMS 105 and heat sink 115A so that the heat sink 115A is completely surrounded by the plastic compound 109. Such a completely embedded heat sink 115A is protected from being affected by fluid flowing through the slots 103, 107 and nozzles 127. This could facilitate a relatively wide range of heat sink materials, and hence, a relatively cost efficient heat sink 115A.

In another example, one side of the first heat sink 115A may extend adjacent the first fluid slot 103. The heat sink 115A may be directly exposed to the first fluid slot 103, or extend at a small distance from the fluid slot 103, small enough so as to allow for heat exchange with fluid flowing through the first fluid slot 103. In operation, the fluid cool of the heat sink 115A, thereby improving cooling of the MEMS 105.

A second heat sink 115B extends completely next to the MEMS 105, for example along at least part of the length of the MEMS 105. Similar to the first heat sink 115A, the second heat sink 115B may one of (i) be adhered to the MEMS 105, (ii) extend at a small distance from the MEMS 105 with plastic compound 109 in between, (iii) be in direct contact with the MEMS 105, and (iv) be in indirect contact with the MEMS 105 through conductive leads or the like. In a further example second heat sink 115B may extend adjacent the front face 111 to allow cooling by ambient air. In one example, the second heat sink 115B is directly exposed to ambient air. In another example, the second heat sink 115B extends at a small distance from the front face 111, so as to allow indirect air cooling but without being directly exposed to air or fluid drops. The second heat sink 115B may extend adjacent the MEMS 105 and front face 111 to allow for heat exchange with these components while being completely surrounded by the plastic compound 109. In a further example only the first or only the second heat sink 115A, 115B is provided along a single MEMS 105 or along two opposite MEMS 105.

FIG. 3 illustrates a diagram of a portion of an example fluid propelling apparatus 201. The apparatus 201 includes a MEMS 205 and heat sink 215 partially or completely embedded in the compound 209. In the illustrated example, the MEMS 205 includes second fluid channels 207A, 207B, 207C and certain chambers 237 or wider channel portions. The second fluid channels 207A, 207B, 207C are directly or indirectly connected to first fluid channels in the compound 209. Thermal resistor actuators 225A, 225B are provided in the second fluid channels 207C and chambers 233. The thermal resistor actuators 225A, 225B locally heat the fluid and thereby generate a vapor bubble that propels the fluid in a desired direction. In one example the second fluid channels include a second fluid feed slot 207A, a fluid feed channel 207B that feeds fluid from the slot 207A to the chamber 233, and a circulation channel 207C, in this example connected to the chamber 233 and the fluid feed slot 207A facilitating fluid circulation. In a further example, the chamber 233 is provided adjacent a nozzle 227 (indicated in dotted line), wherein the thermal resistor actuator 225A in the chamber 233 is to expel fluid out of the chamber 233 through the nozzle 227. A second thermal resistor actuator 225B is provided in the circulation channel 207C. The second thermal resistor actuator 225B may circulate fluid between the different portions of the second channels 207A, 207B, 207C. The second thermal resistor actuator 225B may be triggered by receiving an energy amount that is less than the first thermal resistor actuator 225A but enough to pump the fluid through the circulation channel 207C.

In the illustrate example, the fluidically interconnected chamber 233, nozzle 227, fluid feed channel 207B, fluid circulation channel 207C, and the actuators 225A, 225B together form a drop generating device. At least one array of drop generating devices may be provided over the length of the MEMS 205, for example along the length of the second fluid slot 207A. For example, drop generating device arrays may be provided along both sides of the second fluid slot 207A.

In the illustrated example, one fluid recirculation channel 207C is provided per fire chamber 233. In other examples, one fluid recirculation channel 207C with thermal resistor actuator may connect to multiple chambers 233. Correspondingly, the ratio of the amount of ejection actuators 225A versus the amount of circulation actuators 225B may be 1:1, 2:1 or 3:1. Correspondingly, the ratio of the amount of fire chambers 233 versus the amount of fluid circulation channels 207C in the MEMS 205 could be 1:1, 2:1 or 3:1, respectively. A first column of drop generating devices, that may be fluidically connected to a single second fluid slot 207A, for example along one side of the second fluid slot 207A or on top of the second fluid slot 207A, may have an actuator density of at least approximately 300, 600, 900, 1200 or 1800 actuators per inch, which may include both thermal resistor ejection actuators 225A and thermal circulation actuators 225B. Another similar drop generating device column may extend at an opposite side and/or next to the first drop generating array, fluidically connected to the same second fluid slot 207A. Actuators 225A and/or 225B in the same column may be staggered with respect to each other, i.e. have a different distance from, or slightly different position from the second fluid feed slot 207A. For the sake of clarity, in this disclosure a density of actuators may include both ejection ("fire") and circulation ("pump") actuators that are in the same column, wherein within the same column the actuators may have different positions with respect to the fluid slot 207A.

The circulation actuators 225B may facilitate mixing of fluid(s), which in turn may inhibit clogging of channels and other damage to the MEMS 205. With the circulation actuators 225B, the thermal resistor density may increase, as compared to a MEMS with only thermal ejector resistors 225A. In operation, the circulation actuators 225 may further heat the MEMS 205. A relatively thin MEMS 205 with a relatively high density of thermal resistor actuators 225A, 225B of both types could run a risk of becoming relatively hot in operation, for example when a relatively high amount of thermal resistors within a relatively small surface are actuated at the same time and/or at a relatively high frequency. There may not be enough conductive material such as silicon available in the thin MEMS 205 to conduct heat away from resistor regions in a desired time frame. In addition, the compound 209 may have thermally insulative properties, at least as compared to the silicon, so that heat cannot escape sufficiently fast. In certain examples, even if the composition of the compound 209 is altered to improve thermal conductivity, such as by adding conductive components, the compound 209 could still be relatively thermally insulative as compared to relatively highly conductive material such as silicon. Even thermally conductive compound 209 may not sufficiently conduct heat.

The example fluid propelling apparatus 201 of FIG. 3 includes a heat sink 215 that is provided adjacent the MEMS 205, separate from the MEMS 205. The heat sink 215 may be longitudinally shaped, e.g. rectangular, and extend along the length MEMS 205, for example along at least 50%, 60%, 80% or at least 100% of the length of the MEMS 205. The heat sink 215 may include thermally conductive material such as ceramic, unprocessed silicon, copper, etc. The total volume occupied by the heat sink 215 may be more than the volume occupied by the MEMS 205. In one example the heat sink 215 may have a relatively uniform thermal conductivity, for example by having relatively uniform material properties. In another example the heat sink 215 has a higher thermal conductivity closer to the MEMS 205. In different examples, the heat sink 215 may extend at least partly next to the MEMS 205 and/or at least partly over the MEMS 205.

In an example, both the heat sink 215 and the MEMS 205 have been overmolded by the compound 209. For example, the heat sink 215 is largely or completely surrounded by the compound 209. For example a space 241 between the heat sink 215 and the MEMS 205 may be filled with the molded plastic compound 209 and/or adhesive, for example an epoxy compound. A distance between the heat sink 215 and the MEMS 205 could be between approximately 0.1 and 10 millimeters, or between approximately 0.1 and 3 millimeters. Hence, the fluid propelling apparatus 201 may include a compound 209 with therein embedded a relatively thin sliver MEMS 205 with high density circuitry including resistor arrays and at least one heat sink 215. The heat sink 215 may be longitudinal, bar, strip- and/or cube shaped.

FIG. 4 illustrates a diagram of another example of a cross section of a fluid propelling apparatus 301. The fluid propelling apparatus 301 includes a molded plastic compound 309. The compound 309 includes a first fluid channel 303 that leads to a MEMS 305 embedded in the compound 309 to deliver fluid to second fluid channels in the MEMS 305. A heat sink 315 is embedded in the compound 309 adjacent the MEMS 305.

The MEMS 305 may include silicon, thin film layers and thermal resistors. The MEMS 305 further includes second fluid channels fluidically connected to the first fluid channel 303 wherein the thermal resistors are provided in the second channels. In an example, chambers are provided in the second channels and the thermal resistors are provided in the chambers.

The heat sink 315 extends adjacent the MEMS 305. In the illustrated example, the heat sink 315 extends next to and over the MEMS 305. In the illustrated example, a side of the heat sink 315 extends adjacent the first fluid channel 303 and another side of the heat sink 315 extends adjacent the front face 311 of the fluid propelling apparatus 301. In one example the heat sink 315 includes a lower portion 315A that extends next to the MEMS 305 and a cantilever portion 315B that hangs over the MEMS 305. In another example the heat sink 315 could include two separate blocks or bars, wherein one block or bar extends adjacent the front face 311 and another block or bar adjacent the first fluid channel 303.

For example, in operation, the heat sink 315 exchanges heat with fluid flowing through the second fluid slot 303 and/or with air at the front face 311. In one example, the heat sink 315 directly contacts the fluid or air to enhance cooling. In another example a protective layer may extend between the heat sink 315 and the fluid or air, for example a layer of plastic compound 309, whereby the protective layer is thin enough to enhance cooling and thick enough to protect the heat sink 315 against corrosion, damage, wear, etc.

FIG. 5 illustrates a diagram of yet another example of a cross section of a fluid propelling apparatus 401. The fluid propelling apparatus 401 includes at least one molded plastic compound 409A, 409B. The compound 409A, 409B includes a first fluid channel 403 that leads to a MEMS 405 embedded in the compound 409 to deliver fluid to second fluid channels in the MEMS 405. Furthermore, a heat sink 415 is embedded in the compound 409.

The MEMS 405 may have similar properties as previously addressed MEMS 5, 105, 205, 305. The heat sink 415 extends adjacent the MEMS 405, for example, next to the MEMS 405. In the illustrated example, a side of the heat sink 415 extends adjacent the front face 411 of the fluid propelling apparatus 401. For example, in operation, the heat sink 415 exchanges heat with air at the front face 311 to enhance cooling. In one example, the heat sink 415 directly contacts the air. In another example a protective layer may extend between the heat sink 415 and the air, for example a layer of plastic compound 409, whereby the protective layer is thin enough to enhance cooling and thick enough to protect the heat sink 315 against corrosion, damage, wear, etc.

The compound 409A, 409B may include a second compound layer 409B that has enhanced thermal conductivity with respect to a first layer 409A of the compound 409A, 409B. For example the MEMS 405 is embedded in the second compound 409B of enhanced thermal conductivity. For example the heat sink 415 is at least partly embedded in the second compound 409B. For example the second compound extends between the MEMS 405 and the heat sink 415 to enhance thermal conductivity between the MEMS 405 and the heat sink 415. The enhanced thermal conductivity may be achieved by additives that are included in the second plastic compound 409B. In different examples the additives may include metal, metal oxide, copper, aluminum oxide, silica particles, carbon nano-particles, ceramics, etc. The plastic compound carrier material may include epoxy. The additives may be included in predetermined granulates or layers of the plastic compound before overmolding the heat sink 415 and MEMS 405 in such a manner that more thermally conductive additives are present near the front face 411 of the apparatus than near an opposite, back portion 412. In one example, the plastic compound 409A, 409B may include multiple layers of differently composed plastic compound 409A, 409B. In further example, the compound composition 409A, 409B may be such that a gradient of thermal conductivity is achieved from the back to the front face.

FIGS. 6-9 illustrate diagrams of cross sections perpendicular to front faces of different example fluid propelling apparatus 501, 601, 701, 801. The FIGS. 6-9 illustrate different example patterns of heat sinks and MEMS.

Figure 6:
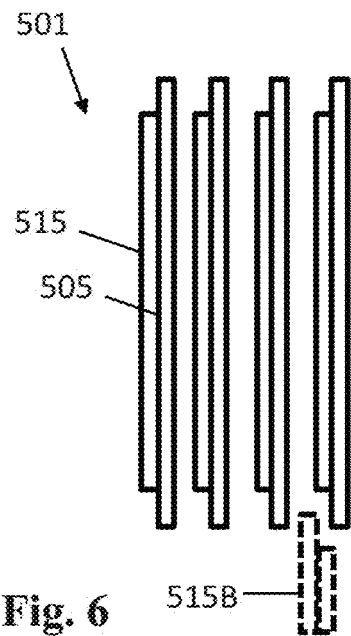

FIG. 6 illustrates a fluid propelling apparatus 501 wherein a plurality of parallel, transversely spaced MEMS 505 are embedded in a compound. A plurality of heat sinks 515 is embedded and extends next to, and parallel to the MEMS 505, along a substantial portion of the length of the MEMS 505. In the illustrated example, one heat sink 515 extends along each one MEMS 505. In the illustrated example the length of the heat sink 515 is less than the length of the MEMS 505. In an example this may be for space efficiency. In another example the end portions of the MEMS 505 may not include thermal resistors so that heat exchange can be better focused on portions where the thermal resistor density is highest. In one example a shorter heat sink 515 may facilitate for space in the compound near the end portions of the MEMS 505 so that electric circuitry may conveniently connect to the end portions of the MEMS 505. In another example, slightly shorter heat sinks 515 or heat sinks 515 near center portions of the MEMS 515 may allow for overlapping MEMS end portions between longitudinally and transversely spaced MEMS 505, 505B. As an example, a part of one longitudinally and transversely spaced MEMS 505B is indicated in dotted lines in FIG. 6.

Figure 7:
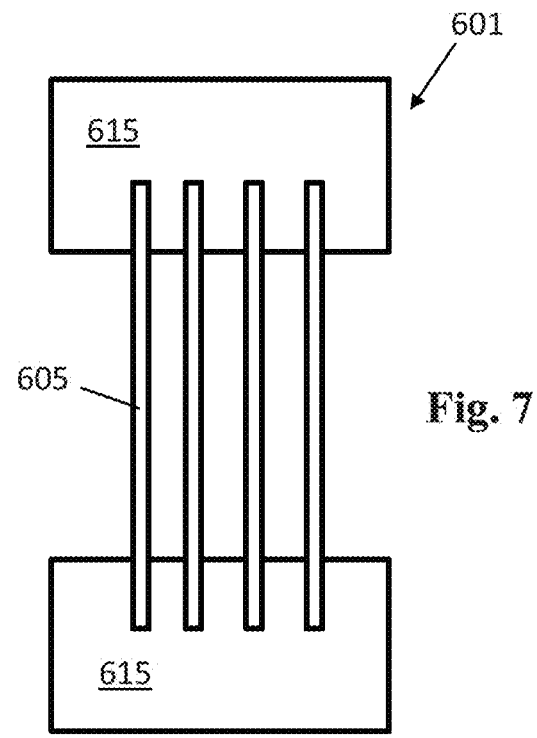

FIG. 7 illustrates a fluid propelling apparatus 601 wherein a plurality of parallel, transversely spaced MEMS 605 are embedded in a compound. At least one heat sink 615 is also embedded and extends near an end portion of the MEMS 605. In the illustrated example, one heat sink 615 extends along end portions of multiple MEMS 605. For example, the heat sink 615 overlaps the end portions of transversely spaced MEMS 605, for example two or four MEMS 605. In one example the heat sink 615 at the MEMS end portion allows for a second fluid slot to extend through the compound along the heat sink 615, to connect to the first fluid channels in the MEMS 605. In the shown example one heat sink 615 extends adjacent first end portions of each of the MEMS 605 and another heat sink 615 extends adjacent opposite, second end portions of each of the MEMS 605. For example, electric circuitry can connect to center portions of the MEMS 605.

Figure 8:
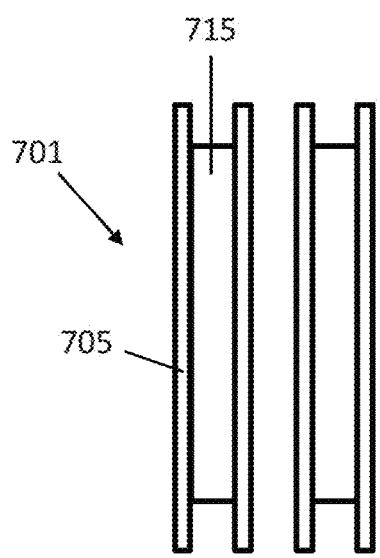
Figure 9:
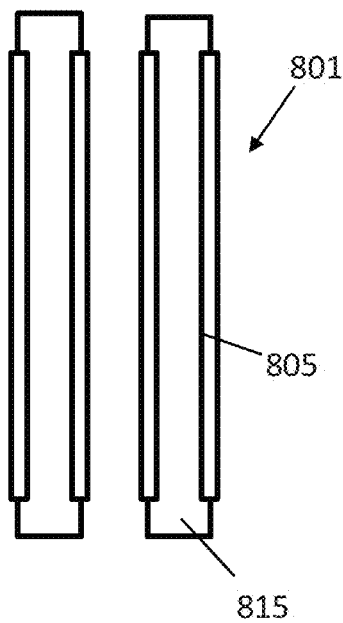

FIGS. 8 and 9 illustrate a fluid propelling apparatus 701, 801 wherein a plurality of parallel, transversely spaced MEMS 705, 805 are embedded in a compound. At least one heat sink 715, 815 is also embedded and extends longitudinally along multiple MEMS 705, 805, at least partly next to the MEMS 705, 805. In the illustrated examples, one heat sink 715, 815 extends between two transversely spaced MEMS 705, 805 over a substantial portion of the length of each MEMS 705. For example, in FIG. 8 the length of the heat sink 715 is less than the length of the MEMS 705. For example, in FIG. 9 the heat sink 815 is longer than the MEMS 805, extending beyond end portions of each MEMS 805.

In different examples of fluid propelling apparatus, the amount of heat sinks versus the amount of MEMS can be 1:4, 1:3, 1:2, 1:1, 2:1, etc. In certain examples, the heat sink may be shorter than, longer than, or of approximately the same length as the MEMS.

FIG. 10 illustrates an example of a method of manufacturing a fluid propelling apparatus. The method may include providing, in a mold, (i) a MEMS largely composed of silicon and including a fluid channel, (ii) a heat sink, adjacent the MEMS to transfer heat away from the MEMS, and (iii) a plastic compound in an at least partly molten state (block 100). The MEMS may further include actuators to propel fluid. The method may further include curing the compound so that the MEMS and heat sink are fixed in position in the hardened compound (block 110). For example, a front face of the MEMS is exposed after curing.

FIG. 11 illustrates another example of a method of manufacturing a fluid propelling apparatus. The method may include adhering a heat sink to a MEMS (block 200). In an example, the MEMS is largely composed of silicon and includes fluid circuitry and actuators. The method may further include providing, in a mold, (i) the MEMS and heat sink, and (ii) a plastic compound in an at least partly molten state (block 210). The method may further include curing the compound so that the MEMS and heat sink are fixed in position in the hardened compound wherein the MEMS is partly exposed (block 220).

FIG. 12 illustrates yet another example of a method of manufacturing a fluid propelling apparatus. The method may include placing a MEMS and heat sink against a release tape in a mold (block 300). The release tape may be a thermal release tape. The method may include depositing plastic compound in the mold (block 310). The plastic compound and/or mold may be heated to at least partially melt the compound. The method may further include compressing the compound in the mold so that it at least partially surrounds both the MEMS and the heat sink (block 320). The method may further include curing the compound whereby the heat sink and MEMS are fixed in position in the hardened compound (block 330). The method may further include releasing the release tape from the MEMS (block 340), and releasing the fluid propelling apparatus from the mold.

FIGS. 13-15 illustrate different states of a method of manufacturing a fluid propelling apparatus, in chronological order, for example corresponding to the example methods of FIGS. 10-12. FIG. 13 illustrates a partially open mold with therein a hot and partially molten compound 909, a MEMS 905 and a heat sink 915. The MEMS 905 and heat sink 915 are adhered to a release tape 951. The MEMS 905 and heat sink 915 may also be adhered to each other through adhesive 929. The mold 953 may be part of compression mold machinery. The mold 953 may include a first shell 955 and a carrier 957. The carrier 957 may support the release tape 951 with MEMS 905 and heat sink 915. The first shell 955 may include a first fluid channel protrusion 957 that is to form a first fluid channel in the compound 909. MEMS 905 may include a substrate and thin film layers with micron-sized second fluid channels 907. The first fluid channel protrusion 957 may be aligned with second fluid channels 907 at a back of the MEMS 905 to align with the second fluid channels 907.

In an example, the protrusion may be included in the first mold shell design. In another example, the protrusion is a mold insert. In again another example the first fluid channel may be finished using machining methods. In again a further example the first fluid channel may be completely machined after molding without being molded.

In FIG. 14, the first mold shell 955 and carrier 957 have been moved towards each other to compress the compound 909 in the mold, thereby overmolding the MEMS 905 and heat sink 915. After the hot compound 909 has been compressed in to the shape of the mold cavity, the compound 909 may be passively cooled, to allow it to cool and fix the heat sink 915 and MEMS 905 in place in the hardened compound 909. After opening the mold 953, the release tape 951 may be readily released from the heat sink 915 and MEMS 905.

FIG. 15 illustrates an example resulting fluid propelling apparatus 901 that may result from the steps of FIGS. 13 and 14. The fluid propelling apparatus 901 may include a heat sink 915 and a MEMS 905 embedded in the compound 909. The compound 909 includes a first fluid channel 903 that may have been shaped at least partly by the molding process and/or at least partly by machining processes. The first fluid channel 903 aligns, and fluidically connects, to second fluid channels 907 in the MEMS 905. The heat sink 915 extends next to and adjacent the MEMS 905 to conduct heat away from the MEMS 905, at least during operation of the MEMS 905.

Fluid propelling apparatus of this disclosure may have different applications. One application may be high precision digitally controlled fluid dispensing such as 2D printing, 3D printing or digital titration, wherein fluid is ejected out of nozzles in a front face of the MEMS. Other example fluid propelling apparatus, such as labs-on-chip, need not necessarily be provided with nozzles. The MEMS may be adapted to allow fluid to run through the apparatus without necessarily ejecting the fluid. The MEMS may include thermal or piezo actuators to act as ejectors and/or pumps to propel fluid through the second fluid channels.

In different examples, the compound may be an epoxy mold compound, a thermal plastic, etc. The heat sink may have any shape and/or size. The heat sink may be made of relatively cheap but conductive material that allows for embedding in plastic compound. Suitable heat sink materials may include copper, ceramics, unprocessed or semi-processed (bulk) silicon, aluminum, nickel iron alloy, carbon-nano particles, etc. Suitable shapes may include block or rectangle sized heat sinks may be applied but other suitable shapes or sub-features may include fins, threads, etc. that may be applied to enhance thermal conductivity.

The fluid propelling apparatus can be a sub-component of a larger apparatus. Any reference to a particular side or orientation in this disclosure should be interpreted as illustrative and not limiting. The presented apparatus can have any orientation. The dimensions and proportions shown in the figures are diagrammatic of nature and should not be explained as limiting.

While the drawings may illustrate a limited amount of actuators and fluid channels, each MEMS may include high density actuator arrays, high density fluid channel arrays, high density chamber arrays, and/or high density nozzle arrays, etc. Also, each fluid propelling apparatus may be provided with at least two of longitudinally stacked MEMS wherein end portions of MEMS of transversally adjacent rows overlap. An example fluid propelling apparatus may be a media wide fluid dispensing apparatus for 2D or 3D printing. Within each MEMS, each fluid channel may in fact include a plurality of fluid channels. In certain examples, cross sectional diameters of the smallest fluid channels in the MEMS may be in the order of approximately 1-40 microns.

The heat sink of this disclosure may be of single solid material that is both cost efficient and thermally conductive. For example, the material may be any bulk material or an alloy. The heat sink may be longitudinal, bar, strip- and/or block shaped. In other examples, the heat sink may have protruding fins or wires to enhance cooling.

What is claimed:

1. A fluid propelling apparatus, comprising
   a plastic compound structure having a first fluid channel;
   a MEMS embedded in the compound structure such that the MEMS is adjacent to the compound structure at three sides of the MEMS, the MEMS including a substrate, a second fluid channel fluidically connected to the first fluid channel, and a column of fluid propelling actuators in the second fluid channel, wherein the first fluid channel does not extend past the second fluid channel; and
   a heat sink, at least partly surrounded by the compound structure to transfer heat away from the MEMS, wherein
   the MEMS has a width less than 2.3 millimeters and a thickness less than 0.8 millimeters, and
   the actuators of the column have a density of at least 300 actuators per inch of length.

2. The fluid propelling apparatus of claim 1 wherein the heat sink extends along at least half of the length of the MEMS.

3. The fluid propelling apparatus of claim 1 wherein a total volume of the heat sink is larger than a total volume of the MEMS.

4. The fluid propelling apparatus of claim 1 wherein
   the substrate comprises silicon and the second fluid channel extends through the substrate, connecting to the first fluid channel,
   the MEMS comprises a thin film structure on the substrate, near a front face, with nozzles connected to the second fluid channel to expel fluid, and
   the heat sink extends next to the MEMS.

5. The fluid propelling apparatus of claim 4 wherein the actuators expel fluid from the nozzles.

6. The fluid propelling apparatus of claim 1 wherein the actuators include thermal resistors to act as pumps to circulate fluid through the second channel.

7. The fluid propelling apparatus of claim 1 wherein the compound structure extends between the MEMS and the heat sink.

8. The fluid propelling apparatus of claim 1 wherein the compound structure includes a first compound and a differently composed second compound of higher thermal conductivity than the first compound, wherein the MEMS and the heat sink are at least partially embedded in the second compound.

9. The fluid propelling apparatus of claim 1 wherein the MEMS is a first MEMS, the fluid propelling apparatus includes a plurality of longitudinally shaped MEMS arranged in parallel, and the first MEMS is one of the longitudinally shaped MEMS.

10. The fluid propelling apparatus of claim 9 wherein the plurality of longitudinally shaped MEMS further includes a second MEMS, and wherein the heat sink extends adjacent at least the first MEMS and the second MEMS to conduct heat away from the first MEMS and the second MEMS.

11. The fluid propelling apparatus of claim 10 wherein the heat sink is a first heat sink, the fluid propelling apparatus including a plurality of heat sinks including the first heat sink, and where the heat sinks are greater than the MEMS in number.

12. The fluid propelling apparatus of claim 1 wherein the heat sink is completely surrounded by the compound.

13. The fluid propelling apparatus of claim 1 wherein the heat sink is at least partially exposed to ambient air or fluid.

14. Method of manufacturing a fluid propelling apparatus, comprising
   providing, in a mold:
      a MEMS including a substrate, a fluid channel and a column of actuators in the fluid channel, the MEMS having a width less than 2.3 millimeters and a thickness less than 0.8 millimeters, the actuators of the column having a density of at least 300 actuators per inch of length,
      a heat sink, adjacent the MEMS to transfer heat away from the MEMS, and
      a plastic compound in an at least partly molten state;
   compressing and curing the compound in the mold so that the MEMS and heat sink are fixed in position in the compound after curing, the MEMS is embedded in a compound structure comprising the compound such that the MEMS is adjacent to the compound structure at three sides of the MEMS, and the heat sink is at least partly surrounded by the compound structure; and
   aligning a fluid channel in the compound structure with the fluid channel in the MEMS, the fluid channel in the compound structure not extending past the fluid channel in the MEMS.

15. Method of claim 14 including adhering the heat sink to the MEMS before placement in the mold.

16. Method of manufacturing a fluid propelling apparatus, comprising
   placing a fluid propelling MEMS and a heat sink against a release tape in a mold, wherein the MEMS has a width less than 2.3 millimeters and a thickness less than 0.8 millimeters, is largely composed of silicon, the MEMS having a fluid channel and a column of actuators in the fluid channel, the actuators of the column having a density of at least 300 actuators per inch of length;
   depositing a plastic compound in the mold to at least partially cover at least one of the MEMS and heat sink;
   compressing the compound in the mold so that it at least partially surrounds the MEMS and heat sink;
   curing the compound whereby the heat sink and MEMS are fixed in position in the compound, the MEMS is embedded in a compound structure comprising the compound such that the MEMS is adjacent to the compound structure at three sides of the MEMS, and the heat sink is at least partly surrounded by the compound structure;

aligning a fluid channel in the compound structure with the fluid channel in the MEMS, the fluid channel in the compound structure not extending past the fluid channel in the MEMS; and releasing the release tape.

\* \* \* \* \*